(12) United States Patent
Bhatia et al.

(10) Patent No.: US 10,847,231 B2
(45) Date of Patent: *Nov. 24, 2020

(54) MEMORY SYSTEM WITH ADAPTIVE READ-THRESHOLD SCHEME AND METHOD OF OPERATING SUCH MEMORY SYSTEM

(71) Applicant: SK hynix Inc., Gyeonggi-do (KR)

(72) Inventors: Aman Bhatia, San Jose, CA (US); Chenrong Xiong, San Jose, CA (US); Fan Zhang, San Jose, CA (US); Naveen Kumar, San Jose, CA (US); Yu Cai, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/557,349

(22) Filed: Aug. 30, 2019

(65) Prior Publication Data

US 2019/0385684 A1 Dec. 19, 2019

Related U.S. Application Data

(63) Continuation of application No. 16/028,050, filed on Jul. 5, 2018, now Pat. No. 10,403,372.

(Continued)

(51) Int. Cl.
| | |
|---|---|
| *G11C 16/26* | (2006.01) |
| *G11C 11/56* | (2006.01) |
| *G11C 29/42* | (2006.01) |
| *G06F 11/30* | (2006.01) |
| *G06F 11/34* | (2006.01) |
| *G11C 8/10* | (2006.01) |
| *G11C 16/28* | (2006.01) |

(Continued)

(52) U.S. Cl.
CPC .......... *G11C 16/26* (2013.01); *G06F 11/3037* (2013.01); *G06F 11/3409* (2013.01); *G11C 8/10* (2013.01); *G11C 11/5642* (2013.01); *G11C 16/28* (2013.01); *G11C 29/021* (2013.01); *G11C 29/028* (2013.01); *G11C 29/42* (2013.01); *G11C 7/14* (2013.01); *G11C 16/0483* (2013.01)

(58) Field of Classification Search
CPC ..... G11C 16/26; G11C 29/021; G11C 29/028; G11C 16/28; G11C 29/42; G11C 11/5642; G11C 8/10; G11C 16/0483; G11C 7/14; G06F 11/3037; G06F 11/3409
USPC ...................................... 365/185.03
See application file for complete search history.

(56) References Cited

U.S. PATENT DOCUMENTS

2017/0125111 A1* 5/2017 Sankaranarayanan ................ G11C 16/26
2017/0206979 A1* 7/2017 Cohen ................ G11C 16/3427
(Continued)

*Primary Examiner* — Fernando Hidalgo
(74) *Attorney, Agent, or Firm* — IP & T Group LLP

(57) ABSTRACT

Adaptive read-threshold schemes for a memory system determine read-threshold with the lowest BER/UECC failure-rates while continuing to serve the host-reads with the required QoS. When it is determined that the QoS or other quality metric is not met for a particular read-threshold, which may be an initial, default, read-threshold, the performance of other read-thresholds are estimated. These estimates may then be used to determine an optimal read-threshold. During the iterative process, selection variables, e.g., how many times, and for which read commands, to use each of the non-default read-thresholds in future read-attempts may be determined on-the-fly.

13 Claims, 6 Drawing Sheets

Related U.S. Application Data

(60) Provisional application No. 62/551,596, filed on Aug. 29, 2017.

(51) Int. Cl.
    *G11C 29/02*     (2006.01)
    *G11C 7/14*     (2006.01)
    *G11C 16/04*     (2006.01)

(56) References Cited

U.S. PATENT DOCUMENTS

2017/0263331 A1*   9/2017   Shi .................. G11C 29/021
2020/0013471 A1*   1/2020   Cohen ............... G11C 16/0483

* cited by examiner

MEMORY SYSTEM WITH ADAPTIVE READ-THRESHOLD SCHEME AND METHOD OF OPERATING SUCH MEMORY SYSTEM

CROSS-REFERENCE TO RELATED APPLICATION(S)

This application is a continuation of U.S. patent application Ser. No. 16/028,050 filed on Jul. 5, 2018, which claims benefits of U.S. Provisional Application No. 62/551,596, filed Aug. 29, 2017. The disclosure of each of the foregoing application is incorporated herein by reference in its entirety.

BACKGROUND

1. Field

Embodiments of the present disclosure relate to a memory system with an adaptive read-threshold scheme, and method of operating such memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller can include an embedded processor that can execute functional components such as firmware. The SSD functional components are typically device specific, and in most cases, can be updated.

The two main types of flash memory components are named after the NAND and NOR logic gates. The individual flash memory cells exhibit internal characteristics similar to those of their corresponding gates. The NAND-type flash memory may be written to and read from in blocks (or pages) which are generally much smaller than the entire memory space. The NOR-type flash allows a single machine word (byte) to be written to an erased location or read independently. The NAND-type flash memory operates primarily in memory cards, USB flash drives, solid-state drives, and similar products, for general storage and transfer of data.

Enterprise SSDs have strict QoS requirements which make use of cost-effective Triple-Level Cell (TLC) NAND Flash difficult. NAND flash store data by storing charge in the floating gates of NAND flash cells into one out of 8 possible PV levels. The charge stored in a cell varies randomly, which variance depends on the condition of the NAND block. This includes the number of program-erase cycles the block has experienced, the retention time for the block, the number of page-reads to the block, and the page-type. Depending on the NAND condition, different read-threshold settings may have different bit-error rates (BERs) and corresponding uncorrectable error-correction code (UECC) failure rates. The BER for a read-threshold may also vary for different blocks and dies. However, the BERs of respective different read-threshold settings are not known a priori.

Thus, there is a need for an adaptive scheme for finding read-thresholds with the lowest BER/UECC failure-rates while continuing to serve the host-reads with the required QoS.

In this context embodiments of the present invention arise.

SUMMARY

Aspects of the present invention include memory systems. Such a memory system may comprise a memory device, a performance tracker, and a read-threshold selector that may be separate or combined with the performance tracker. The performance tracker may be configured to monitor, in response to read commands, read-attempts on the memory device at an initial read-threshold, track performance of the read-attempts at the initial threshold, and estimate performance of each of a plurality of other, non-initial read-thresholds when the performance of the read-attempts at the initial threshold is below a set quality metric. The read-threshold selector may be configured to select when, and how many times, to use each of the plurality of other read-thresholds based on the performance estimates, and determine an optimal read-threshold based on the performance estimates.

Further aspects of the present invention include methods, particularly methods of operating memory systems. Such a method may comprise monitoring, in response to read commands, read-attempts on a memory device of a memory system at an initial read-threshold; tracking performance of performance of the read-attempts at the initial read-threshold; estimating performance of each of a plurality of other, non-initial read-thresholds when the performance of the read-attempts at the initial read-threshold is below a set quality metric; and determining an optimal read-threshold based on results of the estimating operation. When, and how many times, to use each of the plurality of read-thresholds in the estimating operation is determined on-the-fly.

Additional aspects of the present invention will become apparent from the following description.

DETAILED DESCRIPTION

Figure 1:
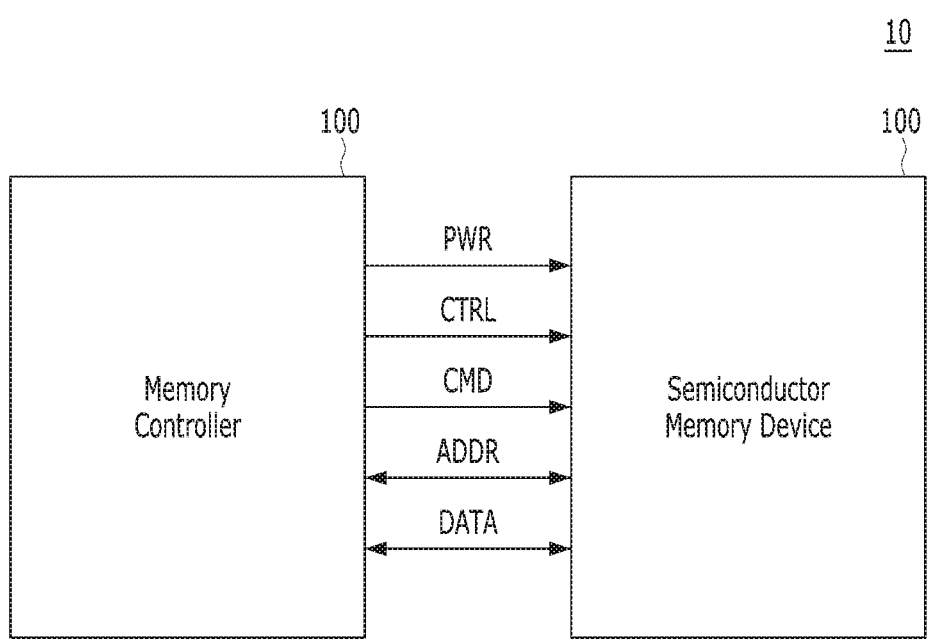
FIG. 1 is a block diagram schematically illustrating a memory system in accordance with an embodiment of the present invention.

Various embodiments are described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrases are not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s), particularly of the NAND-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
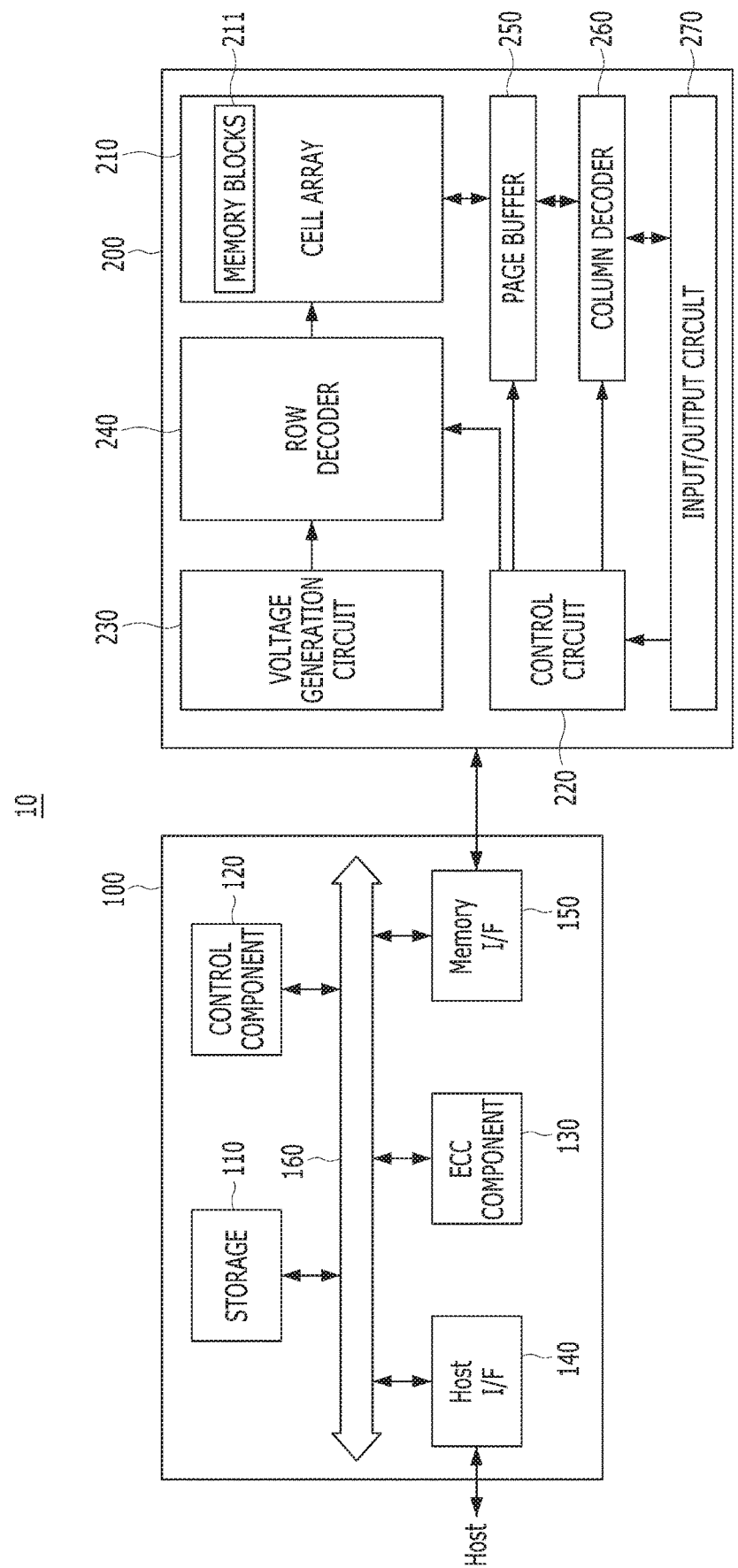
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In some embodiments, the ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). As such, the ECC component 130 may include all circuits, systems or devices for suitable error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
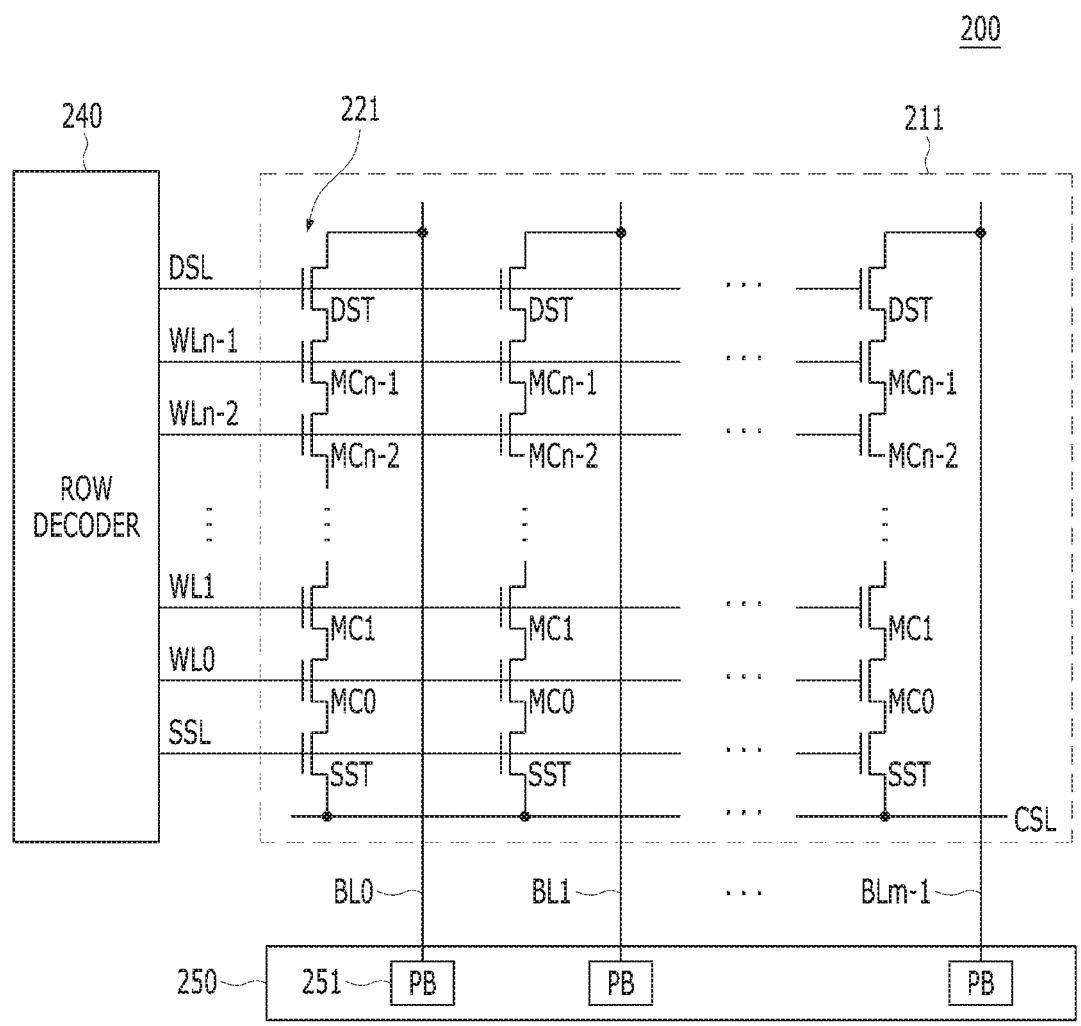
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit/receive data to/from the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
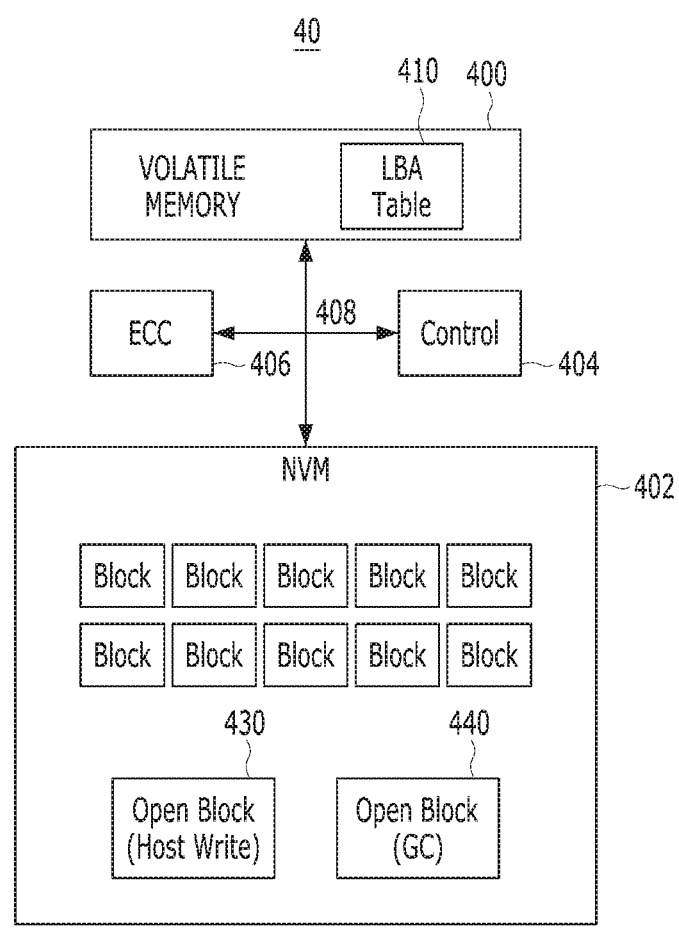
FIG. 4 is a diagram of an exemplary memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address LBA table 410 for mapping physical-to-logical addresses of bits. The NVM 402 may include a plurality of memory blocks (and/or a plurality of super memory blocks), as well as an open block for host writes 430 and an open block for garbage collection (GC) 440. The memory system 40 shows a general memory system. Additional/alternative components that may be utilized with memory systems to effectuate the present invention will be understood to those of skill in the art in light of this disclosure.

Aspects of the present invention are directed to improvements in determining or identifying read-thresholds with the lowest bit-ergo rate (BER)/uncorrectable error-correction code (UECC) failure-rates, while continuing to serve host-reads with the required QoS. Aspects of the present invention are directed to adaptive approaches for determining or identifying an optimal read-threshold, among multiple allowed read-thresholds. Aspects of the present invention may enable use of lower cost TLC NAND flash in enterprise SSDs with more stringent QoS requirements.

In general, adaptive read-threshold schemes of embodiments of the present invention include a QoS tracking module and a read-threshold module, which may be combined into a single module. Such individual modules or a combined module may be embodied in a memory controller, e.g., the memory controller 100 or controller 404.

In an embodiment, the best known read-threshold setting (read-threshold) is used as a default or initial read-threshold in typical scenarios. When the QoS tracking determines that QoS is exceeding the drive specification or other suitable quality metric, performance of other read-thresholds are estimated on host reads. These estimates can then be used to determine the optimal read-threshold, as well as thresholds to use for future read retries.

Starting with a set of N possible read-thresholds, finding the optimal read-threshold can be formulated as a multi-armed bandit (MAB) problem. In an embodiment, firmware may apply a given read-threshold $r\_i$ for a fraction $f\_i$ of the read commands it needs to serve. The fraction $f\_i$ may be modified on-the-fly. To meet the QoS requirements, the firmware may greedily use the best known read-threshold out of the N possible available read-thresholds. This may be considered as the exploitation phase.

Under suitable conditions (e.g., low host traffic and/or long time since last read-retry attempt), the firmware may choose to issue NAND-reads with other thresholds to estimate the BER for those thresholds. This may be considered the exploration-phase.

The exploration-exploitation ratio is determined based on the QoS latency requirements of the SSD. The fraction $f\_i$ may be updated based on various MAB algorithms.

A naive scheme for determining the read-thresholds may be implemented as follows. Given N possible read-thresholds, the firmware may try a fraction 1/N of the host-reads with each threshold and estimate the corresponding BER. This may be considered the learning-phase in such a scheme. After M host-reads, the firmware may use the threshold which has the lowest estimated BER. This may be considered the normal phase.

If the chosen read-threshold is far from the optimal threshold, the BER may be very high and UECC failure may occur for all the NAND-reads with that threshold. The read latency QoS may not be met if a given fraction of the host-reads cannot be met in a single NAND read. Table 1 shows the read latency specification for an enterprise drive in terms of read-latency allowed for each 4 KB host-read command. Table 2 shows the approximate latency for each NAND-read command for a current-generation TLC NAND. Table 3 shows the allowed number of read-attempts and their corresponding percentiles computed based on Tables 1 and 2. Given a requirement that 90% of the host-reads must be served with a single NAND-read, the naive scheme may not be able to meet QoS requirements during the learning phase.

TABLE 1

Maximum allowed latency and percentile of read commands according to a typical enterprise SSD specification.

| Max. Percentile | Allowed Latency |
| --- | --- |
| 90% | 200 us |
| 99% | 300 us |
| 99.9% | 400 us |
| 99.99% | 500 us |

TABLE 2

Number of read-attempts and the latency for a typical TLC NAND device.

| Num. of Read-Attempts | Latency |
| --- | --- |
| 1 | 125 us |
| 2 | 250 us |
| 3 | 375 us |
| 4 | 500 us |
| 5 | 675 us |

TABLE 3

Number of read-attempts and their minimum percentile based on Tables 1 and 2.

| Num. of Read-Attempts | Min. Percentile |
| --- | --- |
| 1 | 90% |
| 2 | 99% |
| 3 | 99.9% |
| 4 | 99.99% |
| 5 | <99.99% |

Since the condition of the NAND flash memory may change over time, the optimal read-threshold may drift away from the read-threshold which estimated BER was the lowest during the learning phase. In other words, the BER is non-stationary. When a UECC failure for a page-read occurs during the normal phase, it is important to choose the read-threshold for the next read-attempt properly so that it has a high probability of success. However, given that an UECC failure has occurred, it is highly likely that the true BERs corresponding to the various read-thresholds may be very different compared to the BER estimations from the learning phase. Therefore, the naive scheme may not be able to meet the QoS requirements in the normal phase as well.

Figure 5:
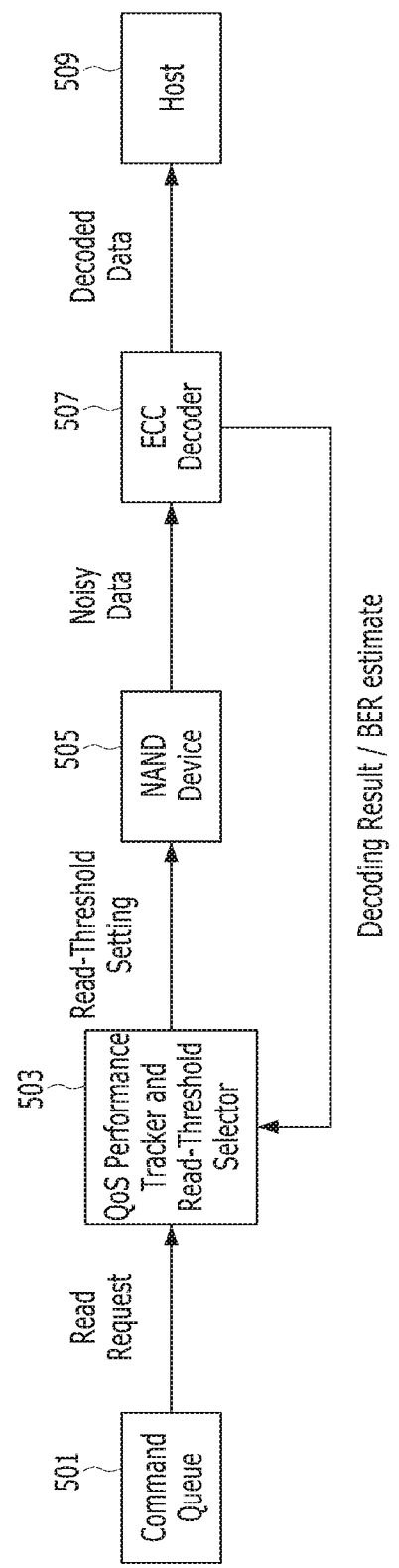
FIG. 5 is a schematic block diagram showing an adaptive read-threshold scheme in accordance with an embodiment of the present invention.

FIG. 5 is block diagram for an adaptive read-threshold scheme in accordance with an embodiment of the present invention. Such a scheme may be implemented in firmware or various combinations of firmware, software and hardware. From a command queue 501, e.g., in a host 509, a read command or request may be issued. Reads of the memory device, e.g., memory device 200, are then attempted at an initial or default read-threshold. The initial or default threshold may be the best known at the time. In an embodiment, a module that combines QoS tracking and read-threshold selection, i.e., a QoS performance tracker and read-threshold selector 503, may monitor the number of read-attempts required for the last P page-reads, where value of P can be determined or set based on the memory available, at an initial or default read-threshold. As noted above, the QoS tracking and read-threshold selection may be performed by different modules.

When the number of read-attempts exceeds a quality metric, which may be a QoS requirement or the QoS specification, as determined by the QoS performance tracker and read-threshold selector 503, it may determine to serve page-reads using read-thresholds different from the default read-threshold. Different read-thresholds are then applied to future read attempts including read-retries. A particular read-threshold $r\_i$ from among the set of allowed read-thresholds may be chosen such that the read-threshold $r\_i$ is chosen a fraction $f\_i$ times. The policy or methodology of selecting a non-default read-threshold may be deterministic or stochastic.

Reads are then attempted on a memory device, e.g., NAND device 505, which may be the memory device 200, at read-threshold $r\_i$. That is, multiple read attempts may be made at each of a plurality of read-thresholds.

The performance of each of these different, non-default read-thresholds may be estimated in reference to a quality metric, such a QoS requirement or QoS specification to determine an optimal read-threshold. Decoding, e.g., ECC decoding, is then performed by ECC decoder 507, which may be embodied in ECC component 130 or ECC module 406. ECC decoder 507 may generate a decoding result for each read-attempt. Noisy data from incorrect reads may result in decoding failures. The result of each read-attempt may be feedback to the QoS performance tracker and read-threshold selector 503, which may then use such information to adjust selection variables, e.g., when, how many times, and for which read commands, to use each of the plurality of non-default read-thresholds in the future read-attempts.

In particular, the value of $f\_i$ may be adjusted or updated based on the result of the ECC decoding after a read, or group of reads. In one embodiment, $f\_i$ may be increased or decreased depending upon the success or failure of the ECC decoding. In another embodiment, the ECC decoder 507 may provide, in addition to the decoding result, an estimate of the BER which may then be used for updating $f\_i$. The value of $f\_i$ may be chosen based on various algorithms known in literature to choose actions in multi-armed bandit problems, for example, Thompson sampling.

Decoded data from the ECC decoder 507 is transmitted to the host 509.

Figure 6:
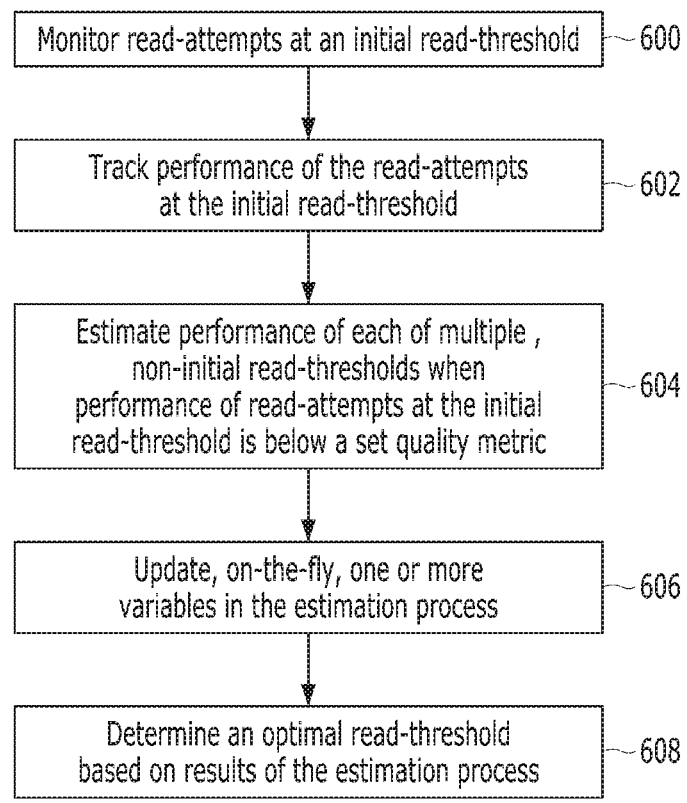
FIG. 6 is a flowchart of steps in a method of operating a memory system or device to perform an adaptive read-threshold scheme in accordance with an embodiment of the present invention.

FIG. 6 is a flow chart describing steps in processes for determining an optimal read-threshold in accordance with an embodiment of the present invention. The steps shown in flow chart 60 are exemplary. Those skilled in the art will understand that additional or alternative steps may be performed, or that the order of the steps may be changed, in order to effectuate aspects of the present invention without departing from the inventive concepts disclosed herein. The steps of flow chart 60 may be performed by memory components disclosed herein, such a controller, memory device, e.g., NAND flash memory, QoS performance tracker and read-threshold selector, ECC component/module, and/or other suitable components, any of which may be implemented with hardware, software, firmware or combination thereof.

Referring to FIG. 6, at step 600, in an exemplary process for determining an optimal read-threshold, read-attempts, made at an initial threshold in response to read commands which may be issued by a host, are monitored. For example, the number of read-attempts at the initial read-threshold required for the last P page-reads may be monitored, where the value of P may be based on the memory available. The initial read-threshold may be the best known read-threshold at the time.

At step 602, the performance of the read-attempts at the initial threshold is tracked to determine whether and which set of non-initial read-thresholds to try. The tracked performance may be based on a set quality metric, such as a QoS specification or requirement thereof. For example, it may be determined that the read-attempts at the initial read-threshold are below the set quality metric when the number of such read-attempts that fail exceeds a particular number, which may be based on a QoS requirement.

When the performance of the read-attempts at the initial read-threshold are determined to be below the set quality metric, performance of each of multiple, non-initial read-thresholds, which constitute a set of allowable read-thresholds, are estimated at step 604. A non-initial read-threshold r_i may be selected for a fraction f_i of read commands to be served. The policy of which non-initial threshold to select at a given time and for how many times may be deterministic or stochastic.

Estimating the performance of the non-initial read-thresholds is generally iterative. As such, at step 606, variables such as f_i may be updated based on the result of decoding after each read or a group of reads. As described above, f_i may be increased or decreased depending upon the success or failure of the ECC decoding, or based on an estimated BER provided by the decoder. Variables including the value of f_i may be chosen in accordance with multi-armed bandit theory.

As the foregoing describes, embodiments of the present invention provide an improved memory system. Embodiments provide read-threshold optimization schemes using QoS tracking. Multi-armed bandit (MAB) algorithms may be employed in selection processes used to determine an optimal read-threshold. Embodiments may reduce variations in read latency. Embodiments provide more consistent performance and a way to ensure that the read-threshold selection policy can meet QoS requirements, which is directly applicable to enterprise SSDs with strict QoS requirements.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A memory system, comprising:
    a memory device;
    a performance tracker configured to:
        estimate performance on the memory device at one or more read-thresholds; and
    a read-threshold selector configured to:
        select when, and how many times, to use each of the plurality of read-thresholds based on the performance estimates, and
        determine an optimal read-threshold based on the performance estimates.

2. The performance tracker of claim 1, further comprising:
    monitor, in response to read commands, read-attempts on the memory device at a first read-threshold,
    track performance of the read-attempts at the first threshold.

3. The memory system of claim 2, wherein a performance tracker is configured to estimate performance of each of a plurality of other read-thresholds when the performance of the read-attempts at the first threshold is below a set quality metric.

4. The memory system of claim 1, wherein the read-threshold selector is configured to select when, and how many times, to use each of the plurality of other read-thresholds on-the-fly.

5. The memory system of claim 1, wherein the read-threshold selector selects a read-threshold r_i, of the plurality of other read-thresholds, to be applied to a fraction f_i of read commands to be served, where i is a natural number.

6. The memory system of claim 5, wherein the read-threshold selector determines f_i based on multi-armed bandit theory.

7. The memory system of claim 5, wherein the read-threshold selector modifies f_i on-the-fly based on the performance estimates.

8. The memory system of claim 1, wherein the performance tracker and the read-threshold selector are embodied as a single component.

9. The memory system of claim 1, wherein the performance tracked and the performance estimated by the performance tracker comprises at least one Quality of Service (QoS) requirement of the memory device, and the set quality metric relates to the at least one QoS requirement.

10. The memory system of claim 1, further comprising:
    a decoder configured to:
        perform decoding after each read-attempt to generate decoding results, and
        transmit the decoding results to the read-threshold selector for use in selecting when, and how many times, to use each of the plurality of other read-thresholds in future read-attempts.

11. The memory system of claim 10, wherein the read-threshold selector is configured to use the decoding results to select when, and how many times, to use each of the plurality of other read-thresholds in future read-attempts.

12. The memory system of claim 1, wherein the read-threshold selector selects the plurality of read-thresholds to be used deterministically or stochastically.

13. The method of claim 2, wherein the first read-threshold is the best read threshold based the performance of read-attempts.

* * * * *